(12) United States Patent
Kim et al.

(10) Patent No.: US 12,150,303 B2
(45) Date of Patent: *Nov. 19, 2024

(54) INTEGRATED ASSEMBLIES HAVING CHARGE-TRAPPING MATERIAL ARRANGED IN VERTICALLY-SPACED SEGMENTS, AND METHODS OF FORMING INTEGRATED ASSEMBLIES

(71) Applicant: Lodestar Licensing Group LLC, Evanston, IL (US)

(72) Inventors: Byeung Chul Kim, Boise, ID (US); Francois H. Fabreguette, Boise, ID (US); Richard J. Hill, Boise, ID (US); Purnima Narayanan, Boise, ID (US); Shyam Surthi, Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 18/138,350

(22) Filed: Apr. 24, 2023

(65) Prior Publication Data

US 2023/0262981 A1 Aug. 17, 2023

Related U.S. Application Data

(63) Continuation of application No. 17/328,237, filed on May 24, 2021, now Pat. No. 11,672,120, which is a (Continued)

(51) Int. Cl.
*H10B 43/27* (2023.01)
*G11C 16/08* (2006.01)
(Continued)

(52) U.S. Cl.
CPC ............ *H10B 43/27* (2023.02); *G11C 16/08* (2013.01); *H01L 21/0214* (2013.01); *H10B 43/35* (2023.02)

(58) Field of Classification Search
CPC ........ H10B 43/27; H10B 43/35; H10B 43/10; H10B 41/10; H10B 41/27; H10B 41/35;
(Continued)

(56) References Cited

U.S. PATENT DOCUMENTS 10,593,695 B1 3/2020 Kim et al.
10,777,576 B1 9/2020 Kim et al.
(Continued)

FOREIGN PATENT DOCUMENTS

CN 107665895 2/2018

OTHER PUBLICATIONS

Fu et al., "A Novel Confined Nitride-Trapping Layer Device for 3D NAND Flash with Robust Retention Performances", Symposium on VLSI Technology Digest of Technical Papers, 2019, United States, 2 pages.

*Primary Examiner* — Tong-Ho Kim
(74) *Attorney, Agent, or Firm* — Brooks, Cameron & Huebsch, PLLC

(57) ABSTRACT

Some embodiments include a memory array having a vertical stack of alternating insulative levels and wordline levels. The wordline levels have conductive terminal ends within control gate regions. The control gate regions are vertically spaced from one another by first insulative regions which include first insulative material. Charge-storage material is laterally outward of the conductive terminal ends, and is configured as segments. The segments of the charge-storage material are arranged one atop another and are vertically spaced from one another by second insulative regions which include second insulative material. The second insulative material has a different dielectric constant than the first insulative material. Charge-tunneling material extends vertically along the stack, and is adjacent to the segments of the charge-trapping material. Channel material
(Continued)

extends vertically along the stack, and is adjacent to the charge-tunneling material. Some embodiments include methods of forming integrated assemblies.

18 Claims, 17 Drawing Sheets

Related U.S. Application Data continuation of application No. 16/988,548, filed on Aug. 7, 2020, now Pat. No. 11,037,956, which is a continuation of application No. 16/374,527, filed on Apr. 3, 2019, now Pat. No. 10,777,576.

(51) Int. Cl.
  *H01L 21/02* (2006.01)
  *H10B 43/35* (2023.01)

(58) Field of Classification Search
  CPC . G11C 16/08; G11C 16/0483; H01L 21/0214; H01L 29/40117
  USPC .......................................................... 257/325
  See application file for complete search history.

(56) References Cited

U.S. PATENT DOCUMENTS

| | | |
|---|---|---|
| 11,037,956 B2 | 6/2021 | Kim |
| 11,672,120 B2* | 6/2023 | Kim .................... G11C 16/08 |
| | | 257/325 |
| 2012/0217564 A1* | 8/2012 | Tang ................... H01L 29/7889 |
| | | 438/270 |
| 2018/0033799 A1 | 2/2018 | Kanamori |
| 2018/0269218 A1* | 9/2018 | Kato .................... H10B 43/40 |
| 2018/0286874 A1 | 10/2018 | Kim et al. |
| 2018/0286876 A1 | 10/2018 | Kim et al. |
| 2019/0035805 A1* | 1/2019 | Lee ..................... H10B 43/27 |
| 2019/0157295 A1* | 5/2019 | Kariya ................. H10B 43/35 |
| 2019/0198509 A1 | 6/2019 | Kim |
| 2019/0198510 A1 | 6/2019 | Kim |
| 2019/0198520 A1 | 6/2019 | Kim et al. |
| 2020/0135745 A1 | 4/2020 | Kim et al. |
| 2020/0144283 A1 | 5/2020 | Kim et al. |
| 2020/0168624 A1 | 5/2020 | Howder et al. |

* cited by examiner

INTEGRATED ASSEMBLIES HAVING CHARGE-TRAPPING MATERIAL ARRANGED IN VERTICALLY-SPACED SEGMENTS, AND METHODS OF FORMING INTEGRATED ASSEMBLIES

RELATED PATENT DATA

This application is a continuation of and claims priority to U.S. patent application Ser. No. 17/328,237, filed May 24, 2021, which is a continuation of and claims priority to U.S. patent application Ser. No. 16/988,548, filed Aug. 7, 2020, now U.S. Pat. No. 11,037,956, which is a continuation of and claims priority to U.S. patent application Ser. No. 16/374,527, filed Apr. 3, 2019, now U.S. Pat. No. 10,777,576, the disclosures of which are hereby incorporated herein by reference.

TECHNICAL FIELD

Integrated assemblies having charge-trapping material arranged in vertically-spaced segments, and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals AO through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the AO through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

DETAILED DESCRIPTION OF THE ILLUSTRATED EMBODIMENTS

Operation of NAND memory cells comprises movement of charge between a channel material and a charge-storage material. For instance, programming of a NAND memory cell may comprise moving charge (i.e., electrons) from the channel material into the charge-storage material, and then storing the charge within the charge-storage material. Erasing of the NAND memory cell may comprise moving holes into the charge-storage material to recombine with the electrons stored in the charge-storage material, and to thereby release charge from the charge-storage material. The charge-storage material may comprise charge-trapping material (for instance, silicon nitride, metal dots, etc.). A problem with conventional NAND can be that charge-trapping material extends across multiple memory cells of a memory array, and can enable charge migration between the cells. The charge migration between memory cells may lead to data retention problems. Some embodiments include NAND architectures having breaks in the charge-trapping material in regions between memory cells; and such breaks may impede migration of charge between memory cells. The charge-trapping material of such NAND architectures may be configured as vertically-spaced segments. In some embodiments, low-k dielectric material (i.e., dielectric material having a dielectric constant of less than about 3.9) may be provided between the vertically-spaced segments of the charge-trapping material.

Figure 1:
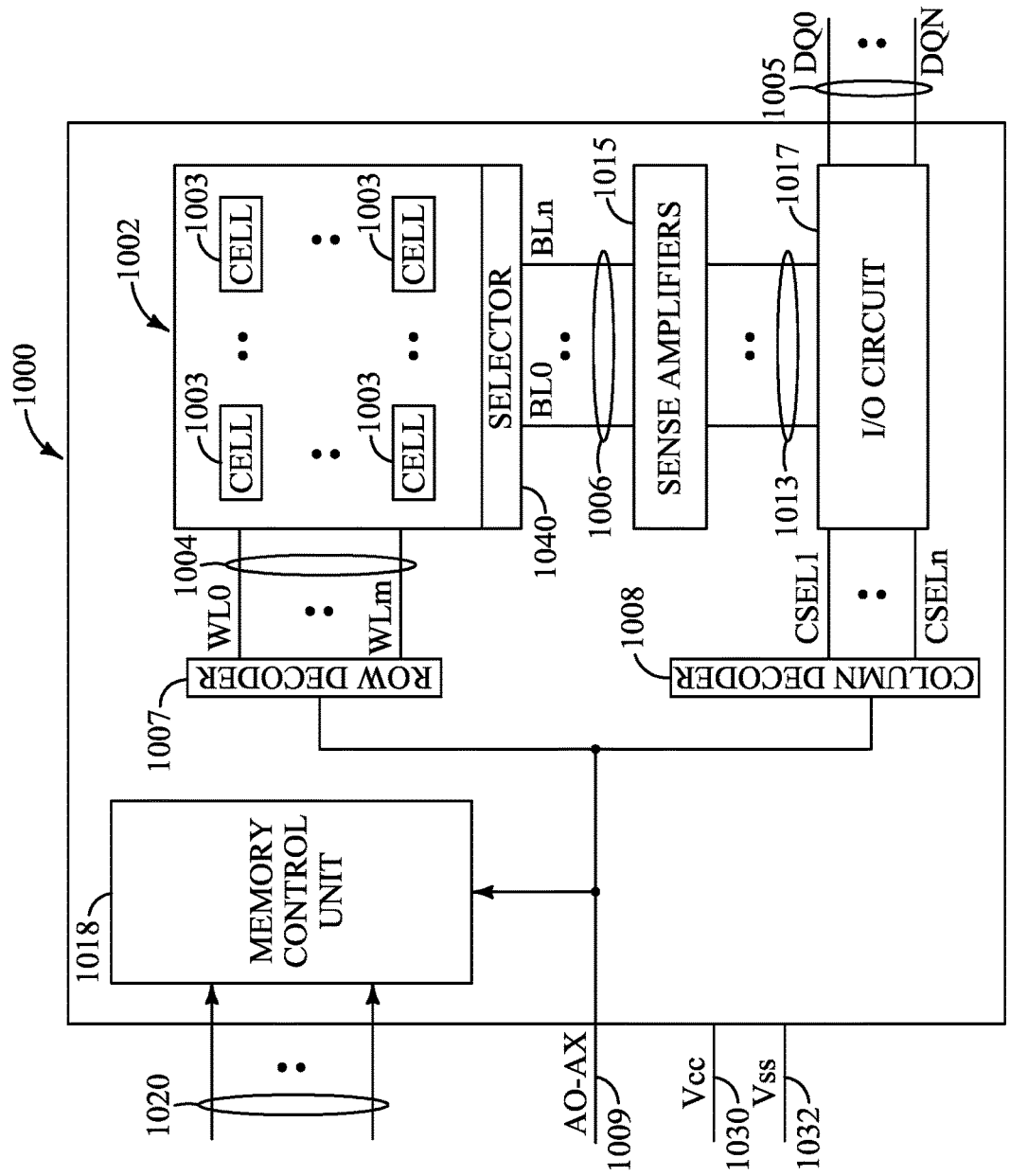
FIG. 1 shows a block diagram of a prior art memory device having a memory array with memory cells.
Figure 2:
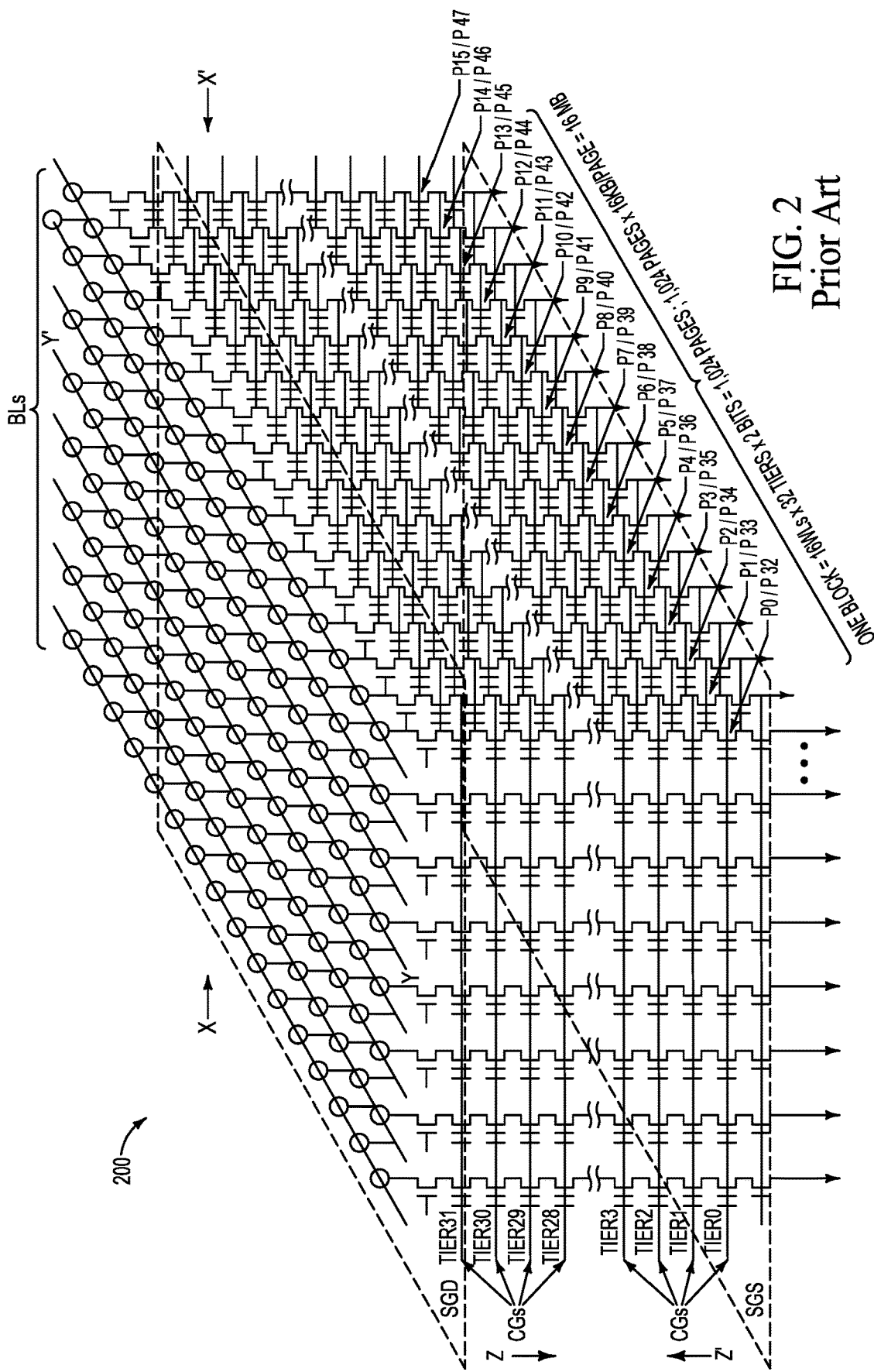
FIG. 2 shows a schematic diagram of the prior art memory array of FIG. 1 in the form of a 3D NAND memory device.
Figure 3:
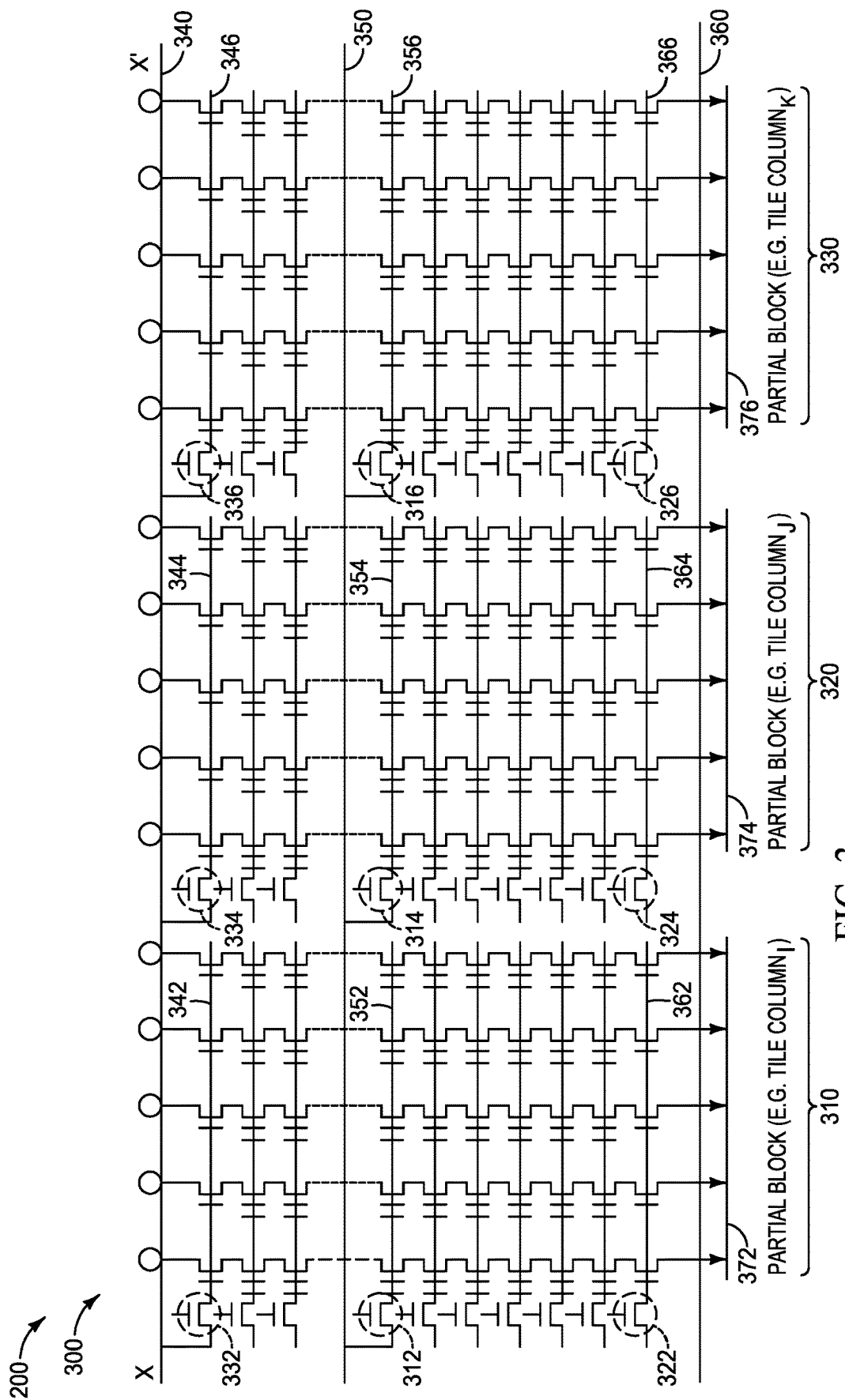
FIG. 3 shows a cross-sectional view of the prior art 3D NAND memory device of FIG. 2 in an X-X' direction.
Figure 4:
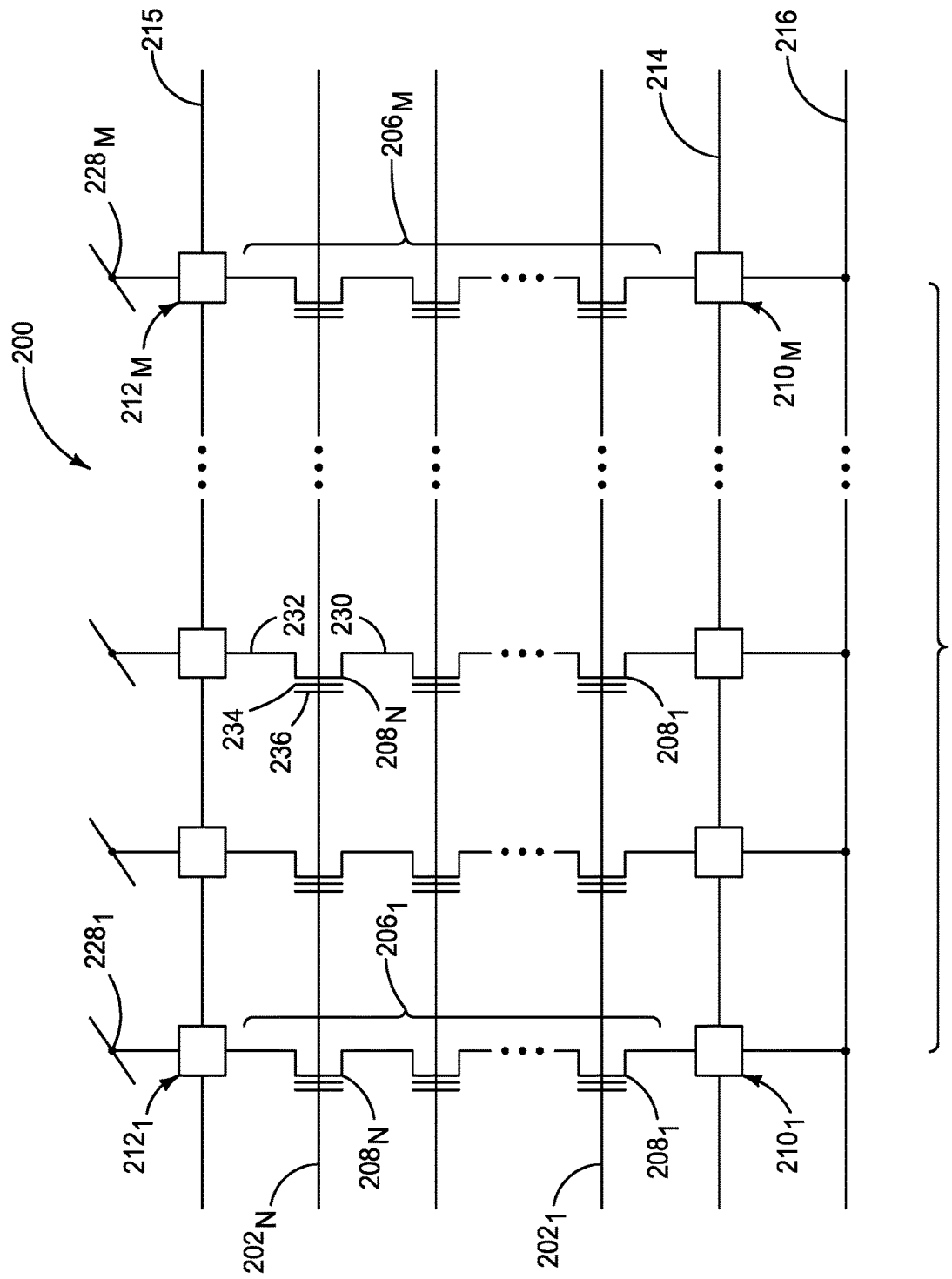
FIG. 4 is a schematic diagram of a prior art NAND memory array.
Figure 5:
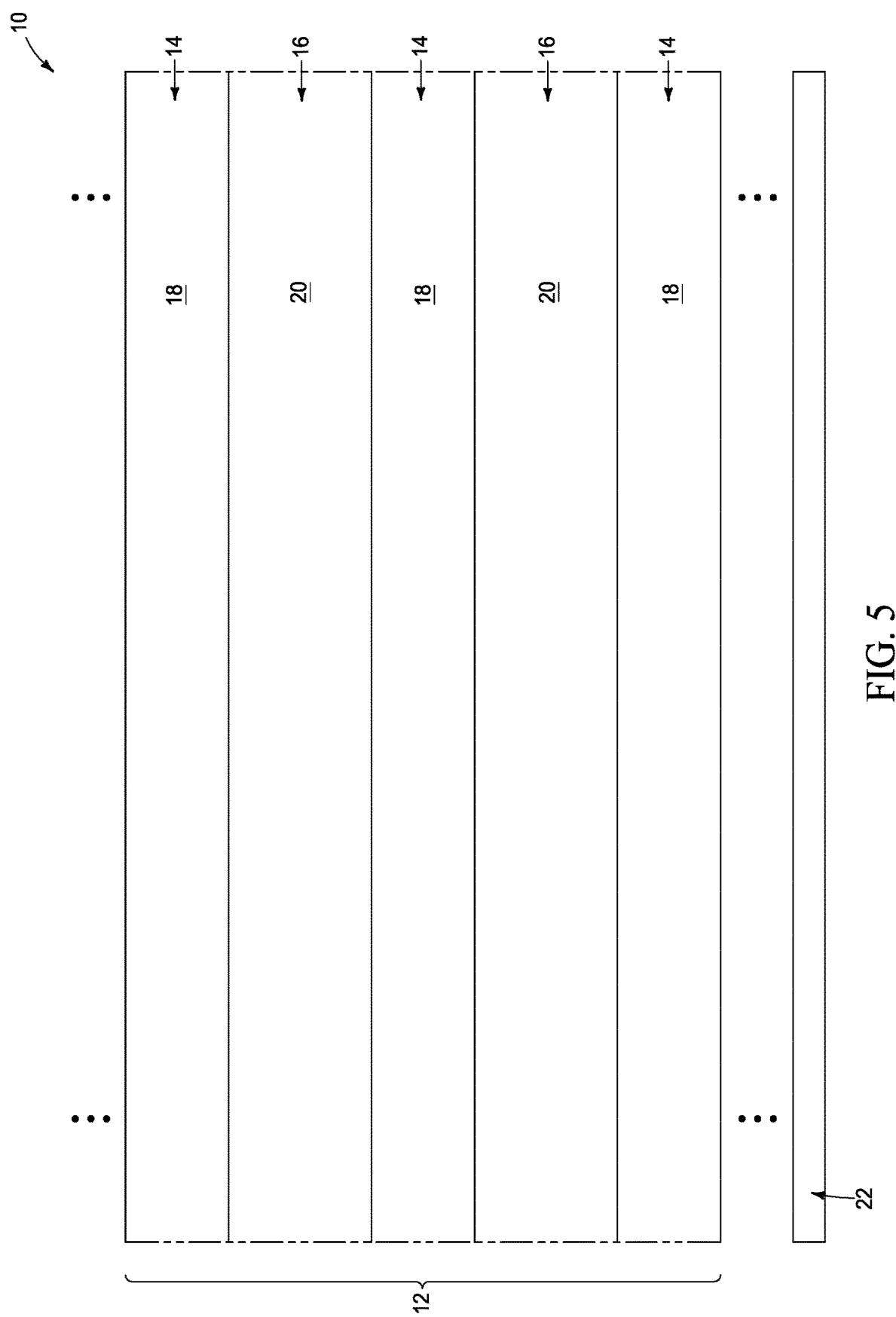
FIG. 5 is a diagrammatic cross-sectional side view of a region of an integrated assembly at an example process stage of an example method for forming an example memory array.

Referring to FIG. 5, a construction (i.e., assembly, architecture, etc.) 10 includes a stack 12 of alternating first and second levels 14 and 16. The first levels 14 comprise first material 18, and the second levels 16 comprise second material 20. The first material 18 may be insulative material (e.g., silicon dioxide), and the second material 20 may be utilized as a sacrificial material; and in some embodiments may comprise, consist essentially of, or consist of silicon nitride. In some embodiments, the materials 18 and 20 may be referred to as a first material and an additional material, respectively.

The levels 14 and 16 may be of any suitable thicknesses; and may be the same thickness as one another, or different thicknesses relative to one another. In some embodiments, the levels 14 and 16 may have vertical thicknesses within a range of from about 10 nanometers (nm) to about 400 nm. In some embodiments, the second levels 16 may be thicker than the first levels 14. For instance, in some embodiments the second levels 16 may have thicknesses within a range of from about 20 nm to about 40 nm, and the first levels 14 may have thicknesses within a range of from about 15 nm to about 30 nm.

Some of the sacrificial material 20 of the second levels 16 is ultimately replaced with conductive material of memory cell gates. Accordingly, the levels 16 may ultimately correspond to memory cell levels (also referred to herein as wordline levels) of a NAND configuration. The NAND configuration will include strings of memory cells (i.e., NAND strings), with the number of memory cells in the strings being determined by the number of vertically-stacked levels 16. The NAND strings may comprise any suitable number of memory cell levels. For instance, the NAND strings may have 8 memory cell levels, 16 and memory cell levels, 32 memory cell levels, 64 memory cell levels, 512 memory cell levels, 1024 memory cell levels, etc. The vertical stack 12 is shown to extend upwardly beyond the illustrated region of the stack to indicate that there may be more vertically-stacked levels than those specifically illustrated in the diagram of FIG. 5.

The stack 12 is shown to be supported over a base 22. The base 22 may comprise semiconductor material; and may, for example, comprise, consist essentially of, or consist of monocrystalline silicon. The base 22 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 22 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 22 to indicate that other components and materials may be provided between the stack 12 and the base 22. Such other components and materials may comprise additional levels of the stack, a source line level, source-side select gates (SGSs), etc.

Figure 6:
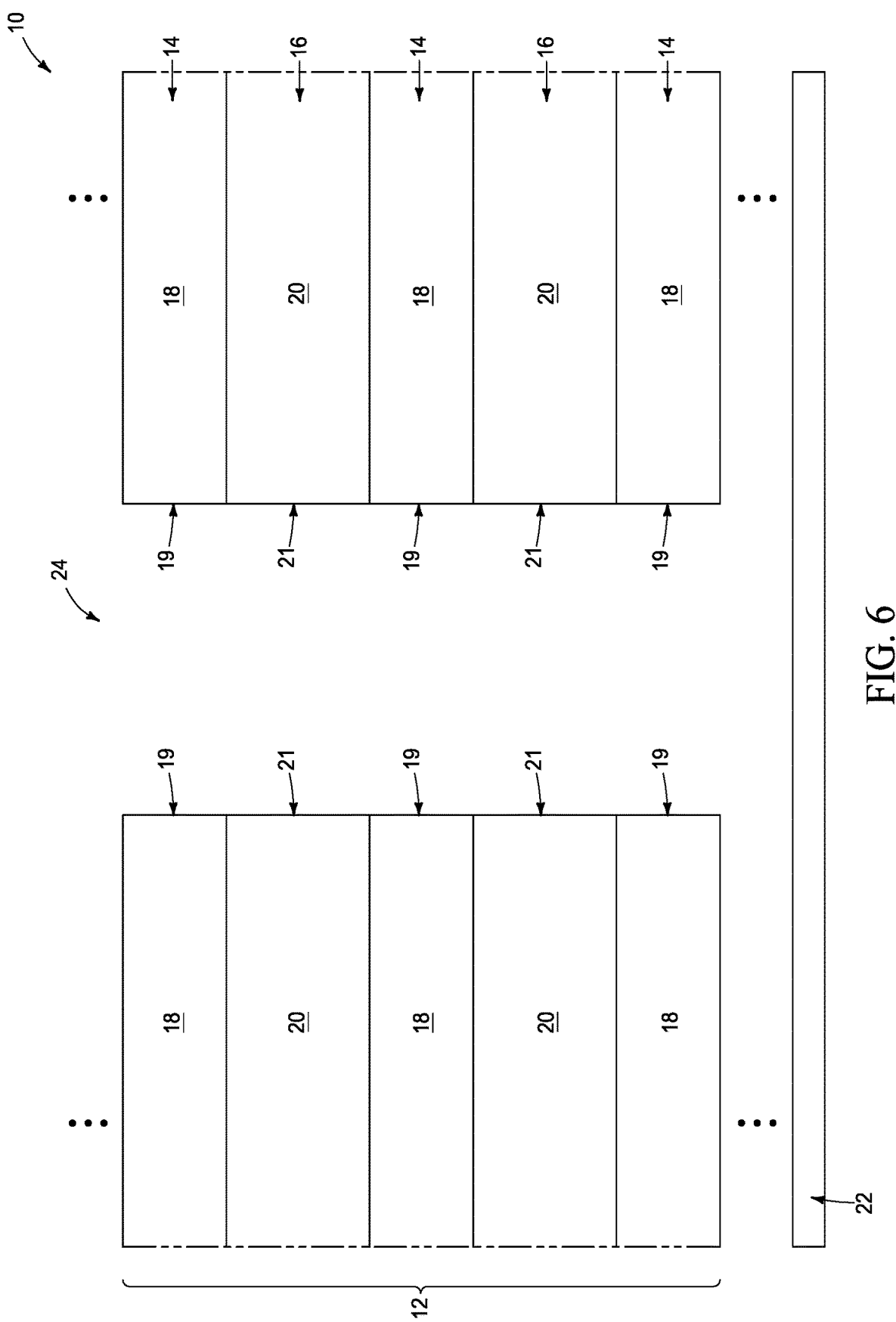
FIG. 6 is a diagrammatic cross-sectional side view of the region of the integrated assembly of FIG. 5 shown at an example process stage following that of FIG. 5.
Figure 6A:
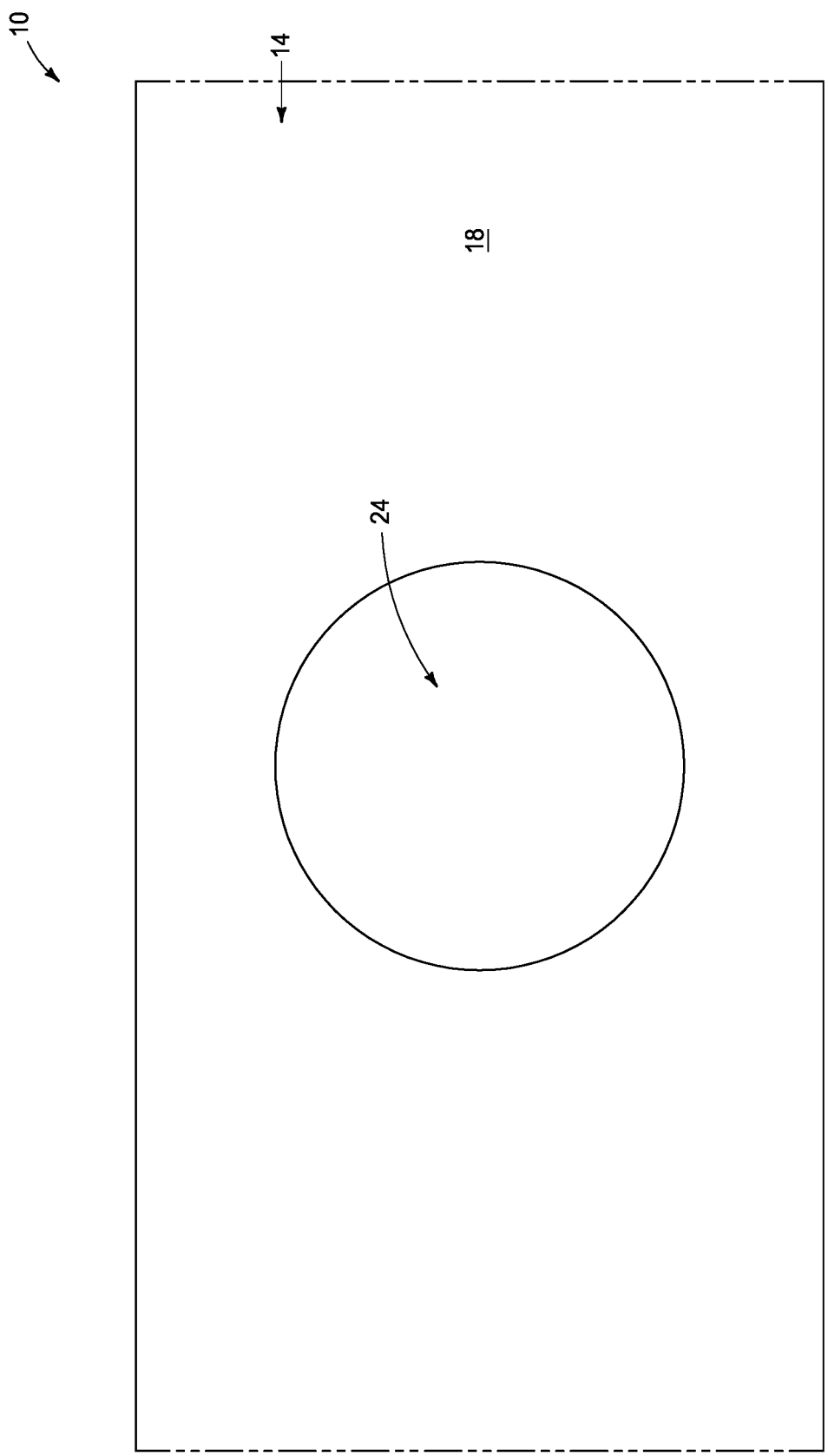
FIG. 6A is a diagrammatic top view of a portion of the integrated assembly of FIG. 6.

Referring to FIG. 6, an opening 24 is formed through the stack 12, with such opening extending through the first and second levels 14 and 16. The opening is ultimately utilized for fabricating channel material pillars associated with vertically-stacked memory cells of a memory array, and in some embodiments may be referred to as a pillar opening. The opening 24 may have any suitable configuration when viewed from above; and in some example embodiments may be circular, elliptical, polygonal, etc. FIG. 6A shows a top view of a portion of the top level 14 of the illustrated region of construction 10, and illustrates an example configuration in which the opening 24 is circular-shaped when viewed from above. The opening may be representative of a large number of substantially identical openings formed through the stack 12 during fabrication of a memory array (with the term "substantially identical" meaning identical to within reasonable tolerances of fabrication and measurement).

The materials 18 and 20 have surfaces 19 and 21, respectively, which are exposed along sidewalls of the opening 24.

Figure 7:
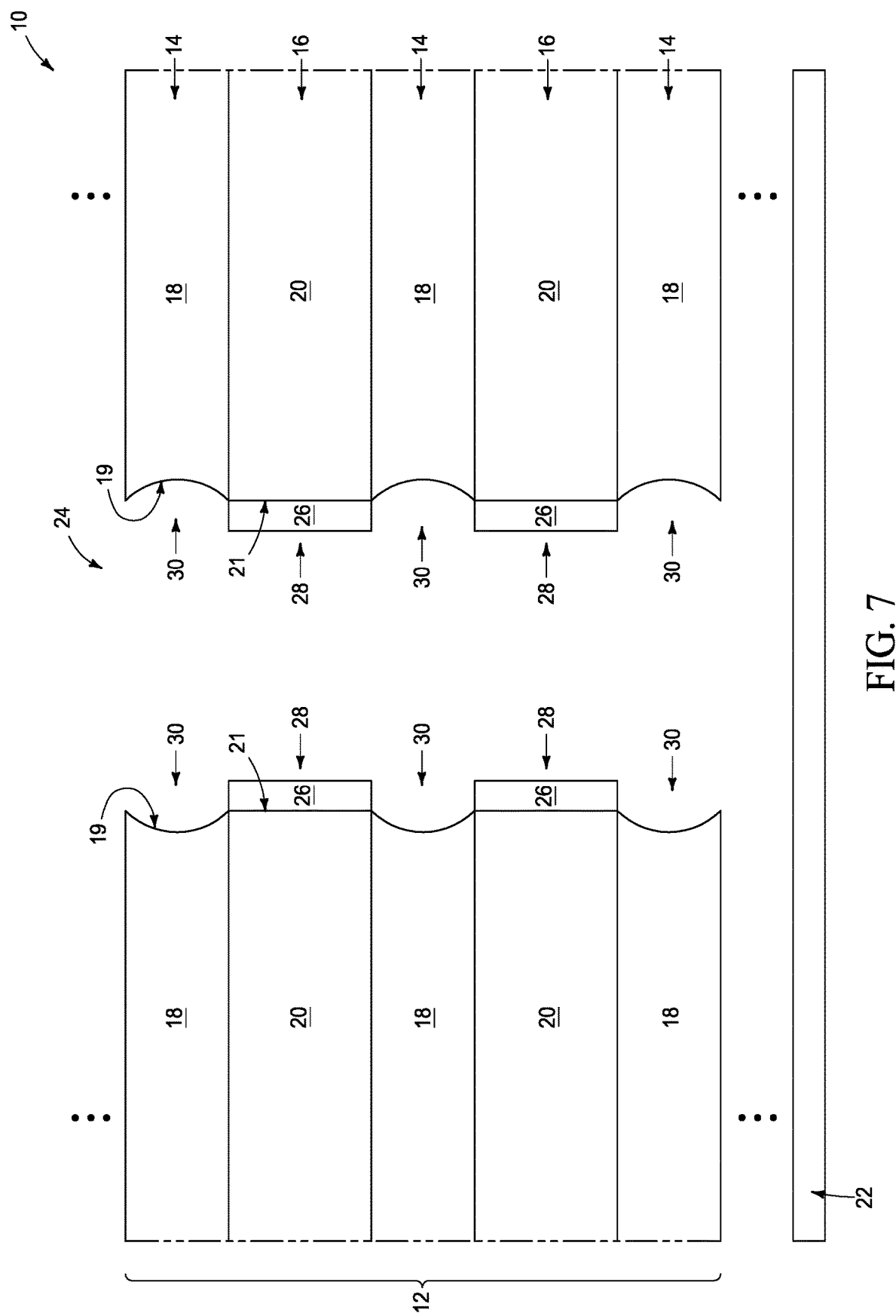
FIGS. 7-16 are diagrammatic cross-sectional side views of the region of the integrated assembly of FIG. 5 shown at example sequential process stages following the process stage of FIG. 6.

Referring to FIG. 7, a material 26 is formed within the opening 24 and along the second levels 16 selectively relative to the first levels 14 (i.e., along the surfaces 21 of the material 20 selectively relative to the surfaces 19 of the material 18). The material 26 is configured as segments 28, with such segments being vertically spaced from one another by recesses 30. The material 26 may comprise any suitable composition(s); and in some embodiments may comprise, consist essentially of, or consist of silicon nitride or polycrystalline semiconductor material (e.g., polycrystalline silicon). The polycrystalline silicon of the material 26 may be in either a doped configuration or in an undoped configuration (generally corresponding to an intrinsically-doped configuration). In some embodiments, some or all of the material 26 is later removed, and thus some or all of the material 26 is sacrificial material.

The material 26 may be selectively formed along the first levels 16 relative to the second levels 14 utilizing any suitable processing. In some embodiments, a hindering material (also referred to herein as a poisoning material) may be selectively formed along the first material 18 relative to the second material 20 to preclude subsequent formation of the material 26 along surfaces of the first material 18, and then the material 26 may be formed by a suitable deposition process (e.g., atomic layer deposition, chemical vapor deposition, etc.). The hindering material may comprise any suitable composition(s); and in some embodiments may comprise one or more of N,N dimethylaminotrimethylsilane, bis(N,N-dimethylamino)dimethylsilane, ethylenediamine, 1-trimethylsilylpyrrolidine, 1-trimethylsilylpyrrole, 3,5-dimethyl-1-trimethylsilyl, and R1-(C—OH)—R2; where R1 and R2 are organic moieties.

In some embodiments, a cleaning step is utilized to treat surfaces of the insulative material 18 (e.g., silicon dioxide) prior to providing the hindering material (not shown) and forming the material 26. The cleaning step may utilize, for example, ammonium fluoride. The cleaning step may recess the exposed surfaces 19 of the first insulative material 18, as shown.

The insulative material 18 may be considered to be exposed along inner lateral surfaces of the recesses 30; with such inner lateral surfaces of the recesses 30 corresponding to the exposed surfaces 19.

The material 26 may be formed to any suitable thickness; and in some embodiments may be formed to a thickness within a range of from about 5 nanometers (nm) to about 20 nm; such as, for example, a thickness within a range of from about 8 nm to about 10 nm.

Figure 8:
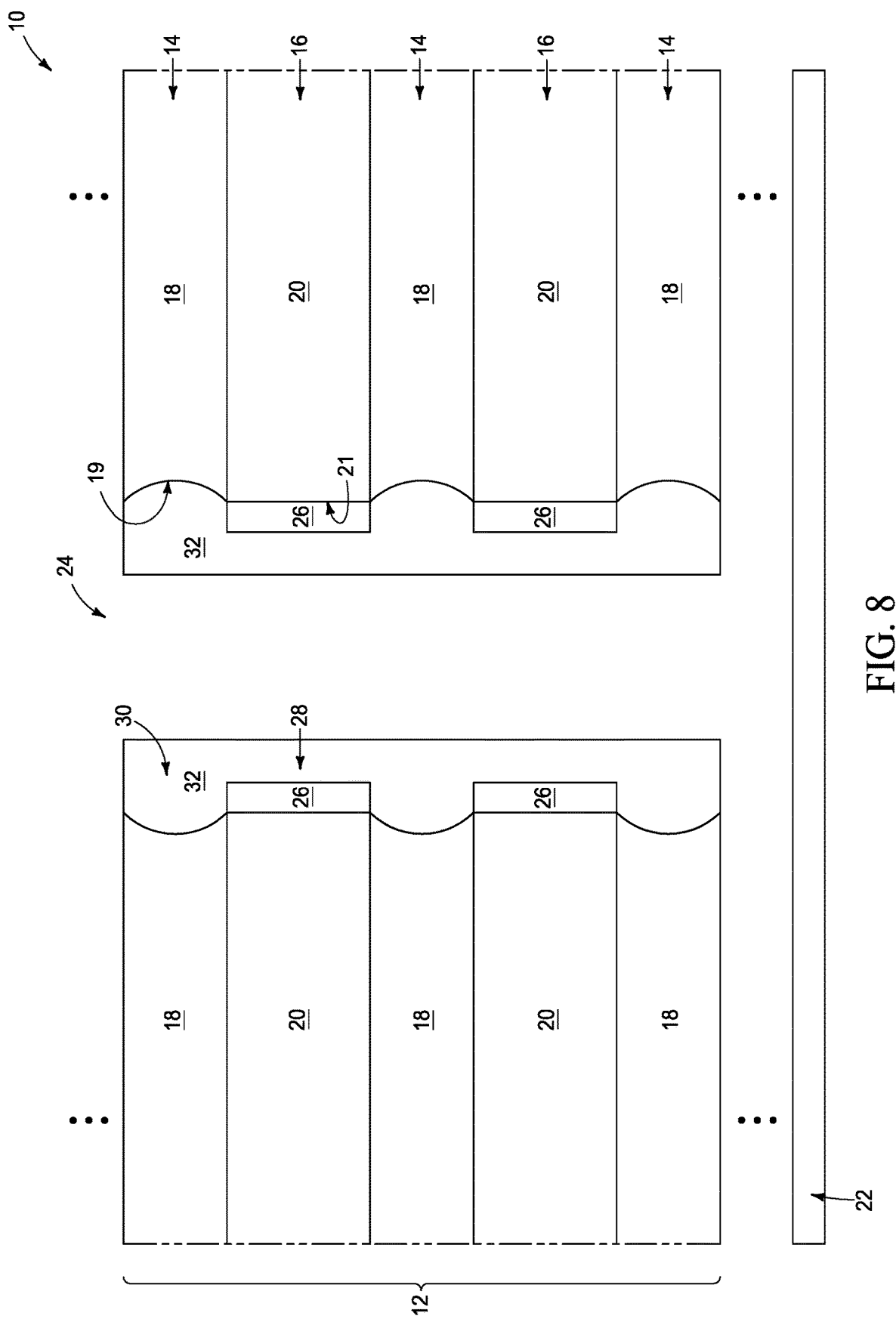

Referring to FIG. 8, insulative material 32 is formed within the opening 24, along the material 26, and within the recesses 30. In some embodiments, one of the insulative materials 18 and 32 may be referred to as a first insulative material while the other is referred to as a second insulative material so that the materials 18 and 32 may be distinguished relative to one another. The utilization of the terms "first" and "second" is arbitrary. In some embodiments, the material 18 is referred to as the first insulative material while the material 32 is referred to as the second insulative material, and in other embodiments the material 32 is referred to as the first insulative material while the material 18 is referred to as the second insulative material.

The insulative material 32 directly contacts the insulative material 18 along the inner lateral surfaces 19 of the recesses 30.

The insulative material 32 may comprise any suitable composition(s). In some embodiments, the insulative material 32 may comprise a same composition as the insulative material 18 (e.g., both may comprise, consist essentially of, or consist of silicon dioxide). In other embodiments, the insulative material 32 may comprise a different composition than the insulative material 18. For instance, the insulative material 32 may have a different dielectric constant than the insulative material 18. In some embodiments, the insulative material 32 comprises a higher dielectric constant than the insulative material 18. In such embodiments, the insulative material 32 may comprise one or more of aluminum oxide, zirconium oxide and hafnium oxide, while the insulative material 18 comprises, consists essentially of, or consists of silicon dioxide. In some embodiments, the insulative material 32 comprises a lower dielectric constant than the insulative material 18. In such embodiments, the insulative materials 18 and 32 may both comprise silicon dioxide; but the silicon dioxide of the material 32 may be more porous than that of the material 18 (i.e., of lower density than the silicon dioxide of material 18), and/or may comprise one or more of carbon, nitrogen and boron (e.g., may correspond to carbon-doped silicon dioxide). In some embodiments, the material 18 may comprise silicon dioxide having a dielectric constant of about 3.9, and the material 32 may comprise a silicon-dioxide-containing composition having a dielectric constant of less than 3.9.

Figure 9:
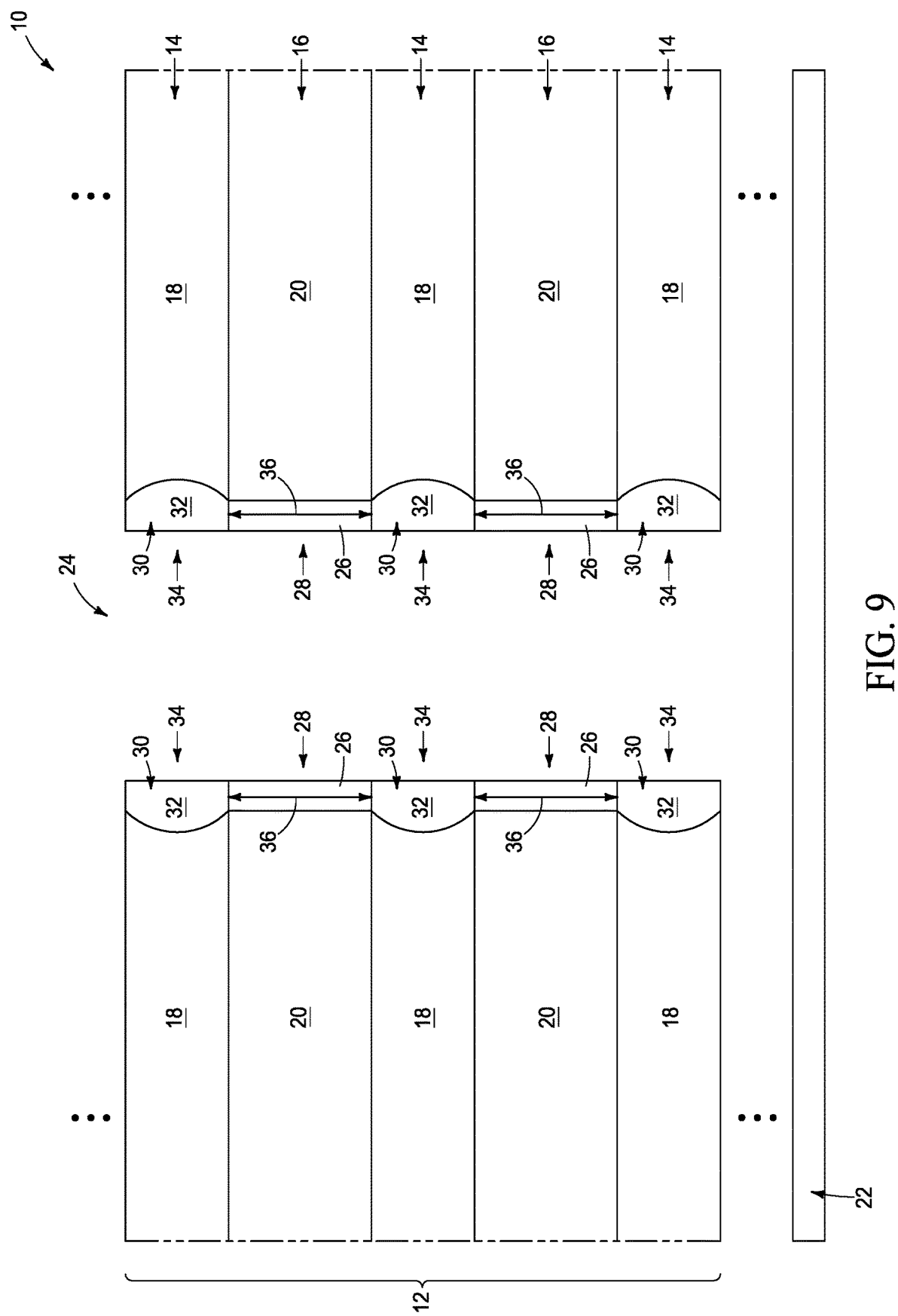

Referring to FIG. 9, the insulative material 32 is removed from along the material 26, while leaving the insulative material 32 within the recesses 30. The insulative material 32 remaining at the process stage of FIG. 9 is configured as segments 34. The segments 34 are vertically spaced from one another by intervening regions 36.

In some embodiments, the segments 28 and 34 may be referred to as first and second segments, respectively, to distinguish such segments from one another.

Figure 10:
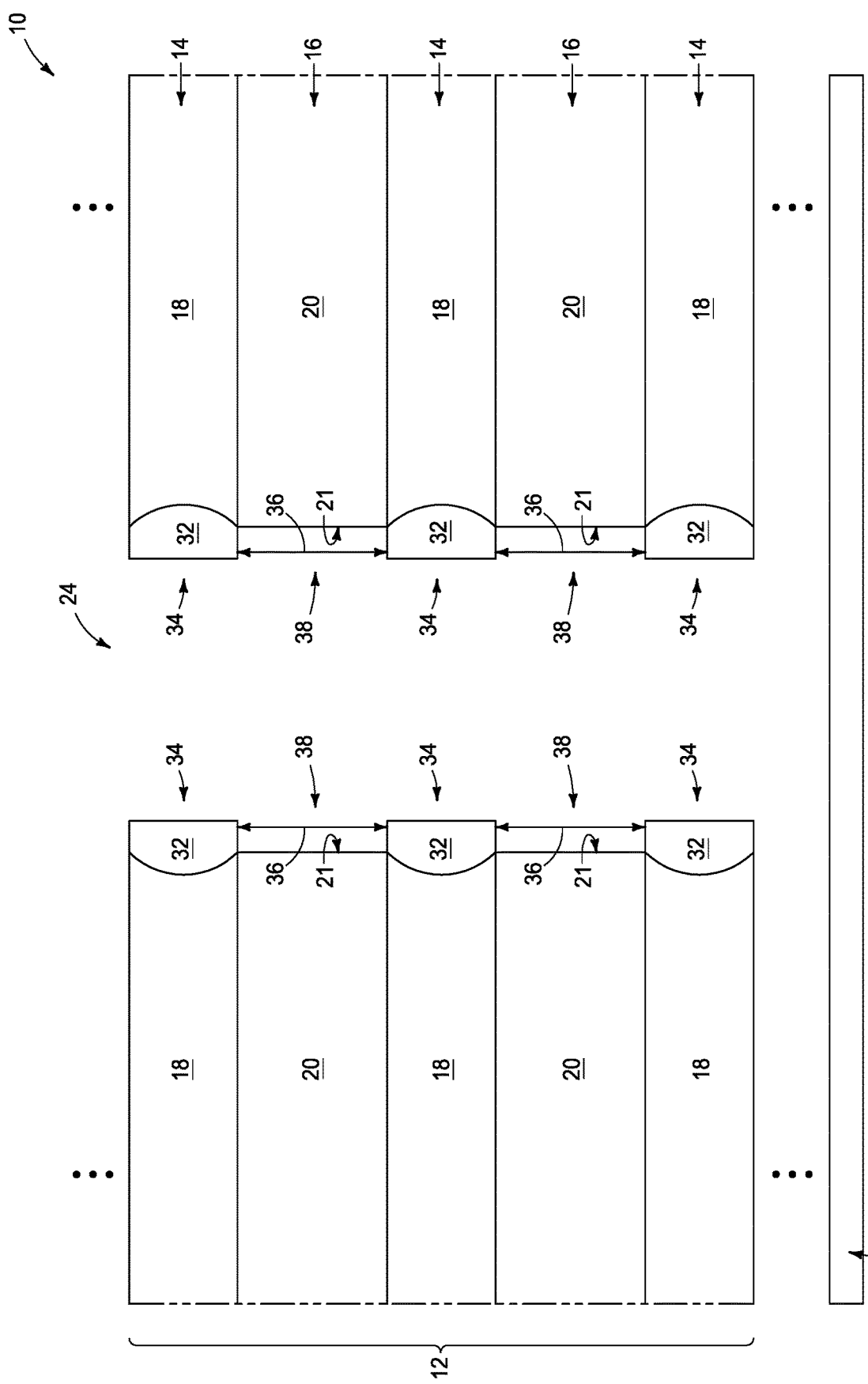

Referring to FIG. 10, the material 26 (FIG. 9) is removed to form recesses 38 within the intervening regions 36. In some embodiments, the recesses 38 may be referred to as second recesses to distinguish them from the first recesses 30 which were described above with reference to FIG. 7.

In the illustrated embodiment, an entirety of the material 26 (FIG. 9) is removed to expose the surfaces 21 of the material 20 within the cavities 38. In other embodiments, only a portion of the material 26 (FIG. 9) may be removed to form the cavities 38. In yet other embodiments, an entirety of the material 26 (FIG. 9) may be removed, and some of the material 20 may also be removed to form the cavities 38.

Figure 11:
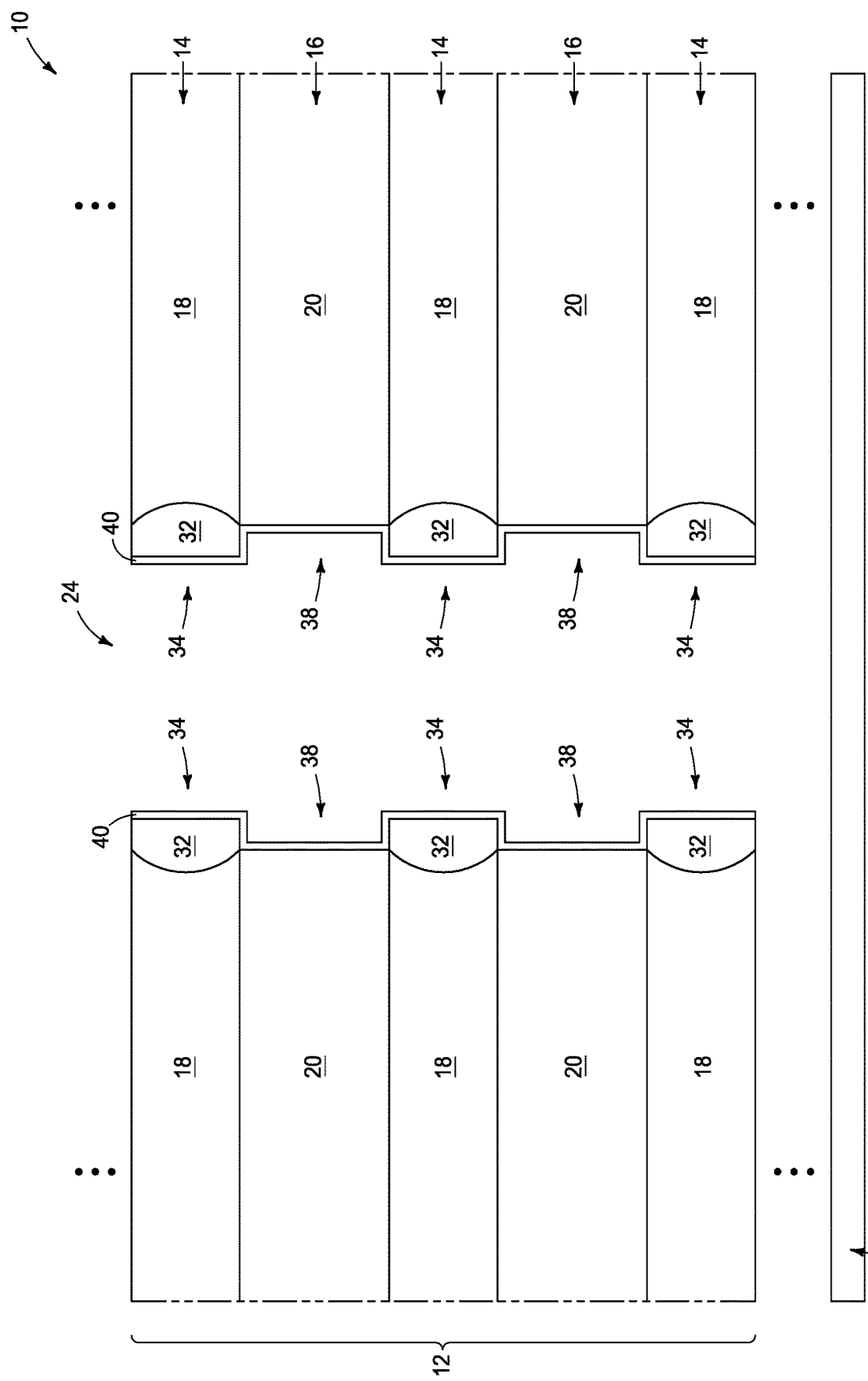

Referring to FIG. 11, charge-blocking material 40 is formed to extend vertically along the first and second levels 14 and 16. The charge-blocking material 40 extends within the recesses 38, and lines the recesses 38. In the illustrated embodiment, the charge-blocking material 40 is along an undulating vertical path which extends conformally along the segments 34 and within the recesses 38.

The charge-blocking material 40 may comprise any suitable composition(s); and in some embodiments may comprise, consist essentially of, or consist of silicon dioxide and/or one or more high-k materials (e.g., aluminum oxide, zirconium oxide, hafnium oxide, etc.); with the term "high-k" meaning a dielectric constant greater than that of silicon dioxide.

Figure 12:
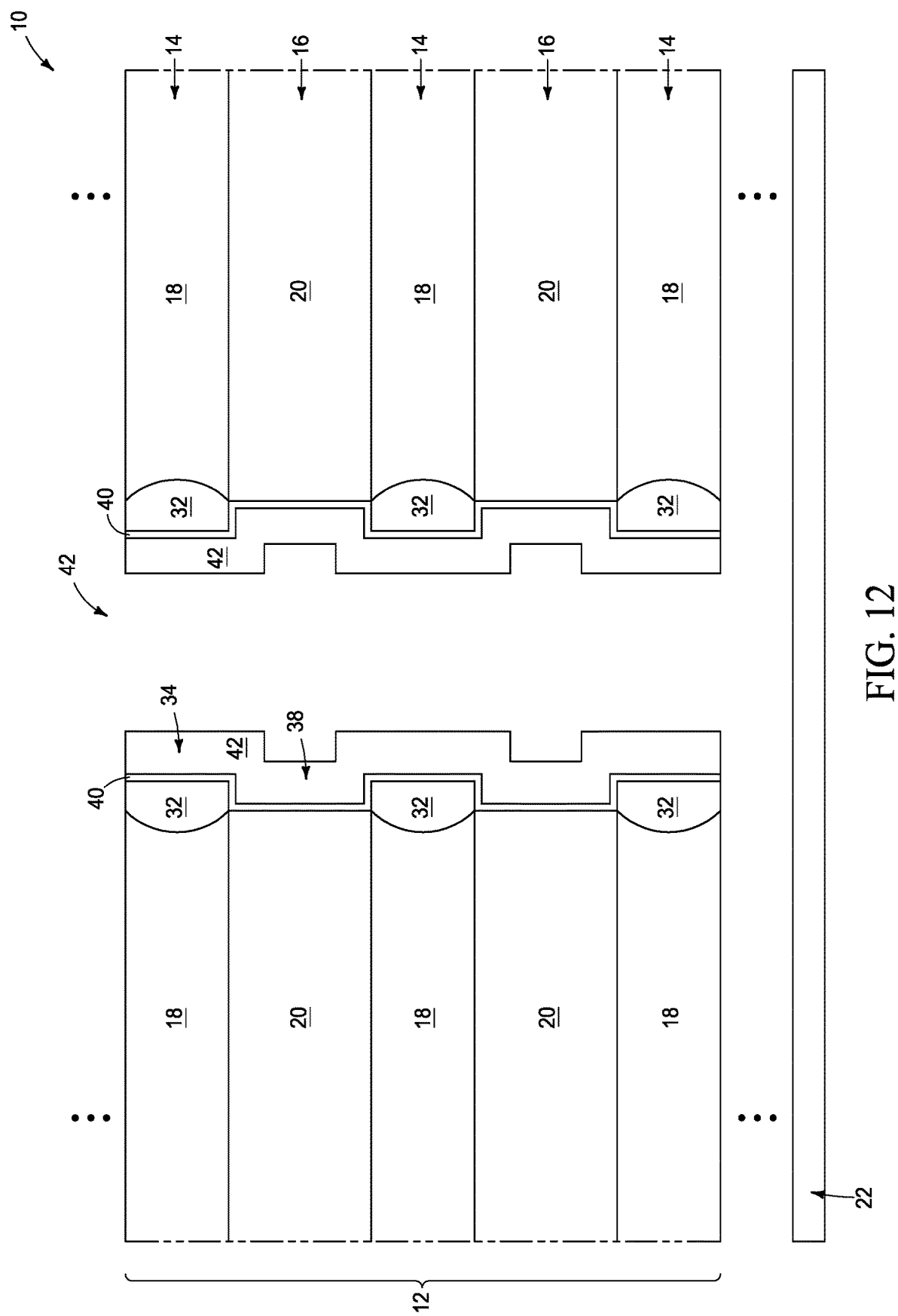

Referring to FIG. 12, charge-storage material 42 is formed to extend along the segments 34 and within the lined recesses 38.

The charge-storage material 42 may comprise any suitable composition(s). In some embodiments, the charge-storage material 42 may comprise charge-trapping materials, such as silicon nitride, silicon oxynitride, conductive nanodots, etc. For instance, in some embodiments the charge-storage material 42 may comprise, consist essentially of, or consist of silicon nitride. In alternative embodiments, the charge-storage material 42 may be configured to include floating gate material (such as, for example, polycrystalline silicon).

Figure 13:
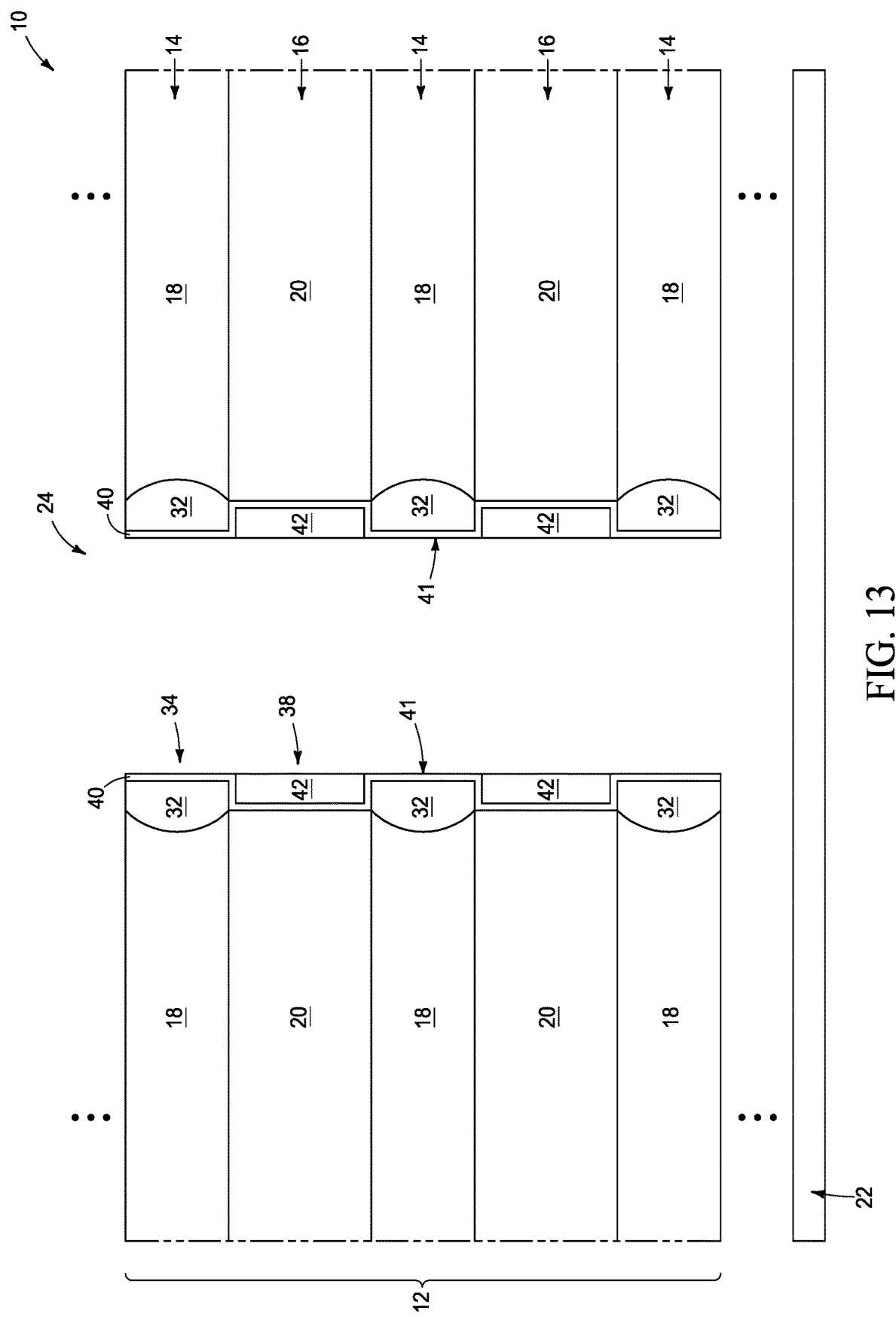

Referring to FIG. 13, the charge-storage material 42 is removed from over the segments 34, while leaving the charge-storage material 42 within the recesses 38. The opening 24 has substantially vertical, planar sidewalls 41 at the processing stage of FIG. 13, with such sidewalls 41 extending along surfaces of the charge-storage material 42 and the charge-blocking material 40 (i.e., extending vertically along the first and second levels 14 and 16).

Figure 14:
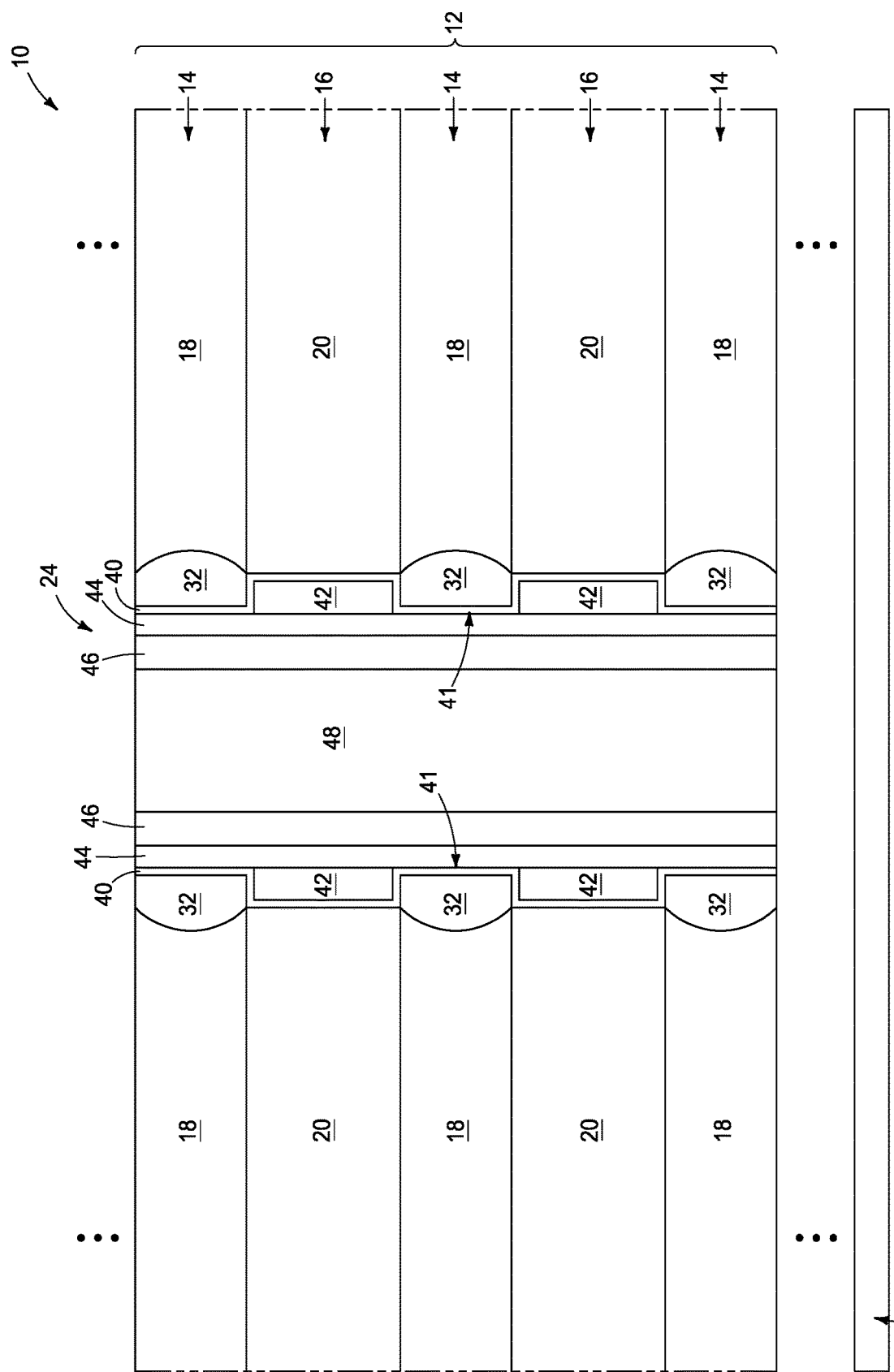

Referring to FIG. 14, tunneling material (gate dielectric material, charge-tunneling material) 44 is formed along the vertical surfaces 41, and channel material 46 is formed along the tunneling material.

The tunneling material 44 may comprise any suitable composition(s). In some embodiments, the tunneling material 44 may comprise, for example, one or more of silicon dioxide, aluminum oxide, hafnium oxide, zirconium oxide, etc.

The channel material 46 comprises semiconductor material; and may comprise any suitable composition or combination of compositions. For instance, the channel material 46 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 46 may comprise, consist essentially of, or consist of silicon.

In the illustrated embodiment, the channel material 46 only partially fills a central region of the opening 24, and insulative material 48 fills a remaining interior region of the opening 24. The insulative material 48 may comprise any suitable composition or combination of compositions, such as, for example, silicon dioxide. The illustrated configuration of the channel material may be considered to comprise a hollow channel configuration, in that the insulative material 48 is provided within a "hollow" in the annular ring-shaped channel configuration. In other embodiments (not shown), the channel material may be configured as a solid pillar configuration.

Notably, the channel material 46 is "flat" (i.e., is substantially vertically of continuous thickness, and is substantially vertically straight), as opposed to being undulating. The flat channel material may positively impact string current as compared to non-flat configurations of some conventional designs. In some embodiments, the configuration of the channel material 46 of FIG. 14 may be referred to as a "flat configuration".

Figure 15:
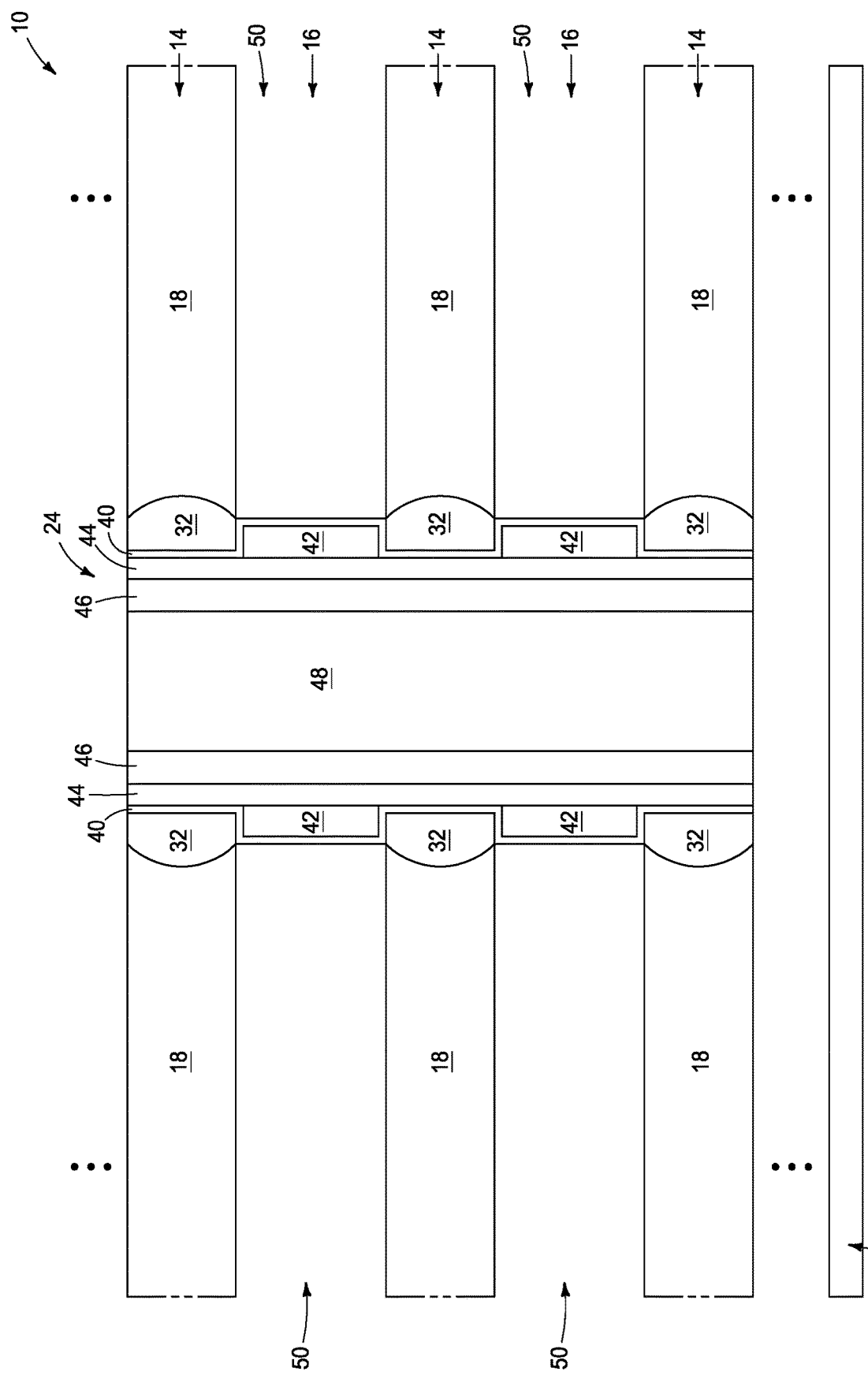

Referring to FIG. 15, the material 20 (FIG. 14) is removed to leave voids 50 along the second levels 16. Such removal may be accomplished with any suitable etch which is selective for the material 20 relative to the materials 18 and 40. For purposes of interpreting this disclosure and the claims that follow, an etch is selective for a second material relative to a first material if the etch removes the second material faster than the first material, which can include, but is not limited to, etches 100% selective for the second material relative to the first material. In a processing step which is not shown, slits may be formed through stack 12 (FIG. 14) to provide access to the first and second levels 14/16. Etchant may be flowed into such slits to remove the second material 20.

Figure 16:
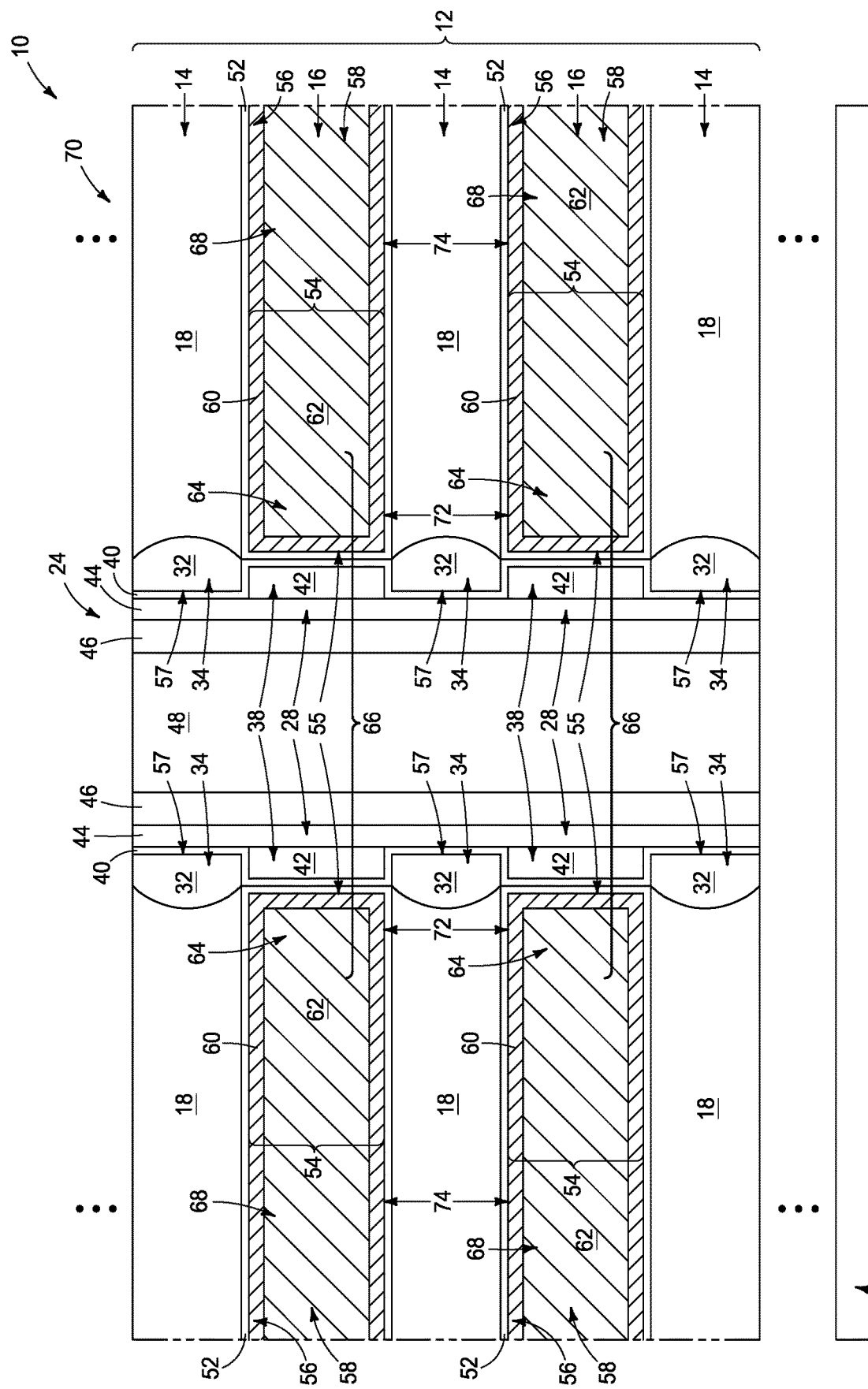

Referring to FIG. 16, the voids 50 (FIG. 15) are lined with dielectric-barrier material 52, and then conductive material 54 is formed within the voids.

The dielectric-barrier material 52 may comprise any suitable composition(s). In some embodiments, the dielectric-barrier material 52 may comprise high-k material (for instance, one or more of aluminum oxide, hafnium oxide, zirconium oxide, tantalum oxide, etc.). In some embodiments, the dielectric-barrier material 52 may comprise, consist essentially of, or consist of aluminum oxide.

The conductive material 54 is shown comprising an outer region 56, and an inner region (or core region) 58. The outer region 56 comprises a first material 60, and the inner region 58 comprises a second material 62. The materials 60 and 62 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the material 60 may comprise one or more metal nitrides; and may, for example, comprise, consist essentially of, or consist of the titanium nitride. In some embodiments, the material 62 may comprise, consist essentially of, or consist of tungsten.

The wordline levels 16 comprise the conductive material 54, and in some embodiments such conductive material may be referred to as conductive wordline material.

The insulative levels 14 comprise the insulative materials 18 and 32.

The insulative levels 14 alternate with the wordline levels 16 within the vertical stack 12 of FIG. 16.

The conductive wordline material 54 comprises terminal ends 55, and the insulative levels 14 comprise terminal ends 57 along edges of the insulative material 32. In some embodiments the terminal ends 55 and 57 may be referred to as first and second terminal ends, respectively. In the illustrated embodiment, the first terminal ends 55 are laterally inset relative to the second terminal ends 57 such that the gaps 38 may be considered to be along the first terminal ends 55 and vertically between the second terminal ends 57.

The wordline levels 16 comprise gates (also referred to herein as gate regions, and as control gate regions) 64 along the terminal ends 55. In some embodiments, the control gate regions 64 may be considered to include the conductive terminal ends 55 (i.e., the terminal ends 55 may be considered to be within the control gate regions 64). The gates 64 are incorporated into memory cells (e.g., NAND memory cells) 66. Such memory cells may be incorporated into a three-dimensional NAND memory array 70 analogous to the NAND memory arrays described above with reference to FIGS. 1-4. The memory cells 66 within the array 70 may be all substantially identical to one another.

The wordline levels 16 comprise conductive wordlines (also referred to herein as wordline regions) 68 proximate the gates 64.

The gates 64 are vertically-spaced from one another by insulative regions 72 comprising the insulative material 18 of the insulative levels 14. Similarly, the wordlines 68 are vertically spaced from one another by intervening regions 74 comprising the insulative material 18 of the insulative levels 14.

The insulative levels 18 comprise the insulative material 32 within the second terminal end 57, and comprise the insulative material 18 proximate the second terminal ends 57 and within the intervening regions 72 and 74. In some embodiments, the insulative material 32 may be considered to comprise segments 34 which are vertically between segments 28 of the charge-storage material 42. The segments 28 may be considered to be arranged one atop another, and to be vertically spaced from one another by the intervening segments 34 of the insulative material 32.

As noted above, in some embodiments the insulative material 18 may comprise a different dielectric constant than the insulative material 32. In some embodiments, it may be advantageous for the insulative material 32 to comprise low-k dielectric material (i.e., dielectric material having a dielectric constant less than 3.9) in that such may alleviate capacitive coupling between the vertically-spaced segments 28 of the charge-trapping material 42. In such embodiments, the insulative material 32 may comprise porous silicon dioxide and/or silicon dioxide containing one or more of carbon, nitrogen and boron. In some embodiments, the insulative material 18 may consist essentially of, or consist of silicon dioxide, and may have a higher dielectric constant than the low-k material 32.

The charge-blocking material 40 extends vertically along the stack 12, is along the first and second ends 55 and 57, and lines the gaps 38. The charge-storage material 42 is within the lined gaps 38. In some embodiments, the charge-blocking material 40 may be considered to have an undulating vertical path which extends conformally along the first and second ends 55 and 57.

The charge-tunneling material 44 and the channel material 46 may be considered to extend vertically along the stack 12, and to be adjacent the levels 14 and 16 within such stack. In some embodiments, the charge-tunneling material 44 may be considered to extend vertically along the stack 12, and to have a substantially planar vertical path which extends along regions of the charge-blocking material 40, and along the charge-storage material 42.

In operation, the charge-storage material 42 may be configured to store information in the memory cells 66. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 64, and/or based on the value of voltage applied to the channel material 46.

The tunneling material 44 forms tunneling regions of the memory cells 66. Such tunneling regions may be configured to allow desired migration (e.g., transportation) of charge (e.g., electrons) between the charge-storage material 42 and the channel material 46. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 40 is adjacent to the charge-storage material 42, and may provide a mechanism to block charge from flowing from the charge-storage material 42 to the associated gates 64.

The dielectric-barrier material 52 is provided between the charge-blocking material 40 and the associated gates 64, and may be utilized to inhibit back-tunneling of charge carriers from the gates 64 toward the charge-storage material 42. In some embodiments, the dielectric-barrier material 52 may be considered to form dielectric-barrier regions within the memory cells 66.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory array which has a vertical stack of alternating insulative levels and wordline levels. The wordline levels include conductive wordline material which has first terminal ends. The conductive wordline material is configured to include conductive wordlines along the wordline levels. The conductive wordlines are vertically spaced from one another by intervening regions of the insulative levels. The insulative levels have second terminal ends. The first terminal ends are laterally inset relative to the second terminal ends such that gaps are along the first terminal ends and vertically between the second terminal ends. The insulative levels include first insulative material within the second terminal ends, and include second insulative material proximate the second terminal ends and within the intervening regions. The first insulative material has a different dielectric constant than the second insulative material. Charge-blocking material extends vertically along the stack, is adjacent to the first and second terminal ends, and lines the gaps. Charge-storage material is within the lined gaps. The charge-storage material is configured as first segments which are arranged one atop another, and which are vertically spaced from one another by intervening second segments which include the first insulative material within the second terminal ends. Charge-tunneling material is adjacent to the charge-storage material. Channel material extends vertically along the stack, and is adjacent to the charge-tunneling material.

Some embodiments include a memory array having a vertical stack of alternating insulative levels and wordline levels. The wordline levels have control gate regions which include conductive terminal ends of the wordline levels. The control gate regions are vertically spaced from one another by first insulative regions which include first insulative material. Charge-storage material is laterally outward of the conductive terminal ends. The charge-storage material is configured as segments. The segments of the charge-storage material are arranged one atop another and are vertically spaced from one another by second insulative regions which include second insulative material. The second insulative material has a lower dielectric constant than the first insulative material. Charge-tunneling material extends vertically along the stack, and is adjacent to the segments of the charge-trapping material. Channel material extends vertically along the stack, and is adjacent to the charge-tunneling material.

Some embodiments include a method of forming an integrated assembly. A vertical stack of alternating first and second levels is formed. The first levels comprise first insulative material, and the second levels comprise additional material. An opening is formed to extend through the first and second levels. A sacrificial material is formed within the opening and along the second levels selectively relative to the first levels. The sacrificial material is configured as first segments which are vertically spaced from one another by first recesses. The first insulative material is exposed along inner lateral surfaces within the first recesses. Second insulative material is formed within the opening, along the sacrificial material and within the first recesses. The second insulative material directly contacts the first insulative material along the inner lateral surfaces. The second insulative material is removed from along the sacrificial material while leaving the second insulative material remaining within the first recesses. The second insulative material remaining within the first recesses is configured as second segments which are vertically spaced from one another by intervening regions. The sacrificial material is removed to form second recesses within the intervening regions. Charge-storage material is formed within the second recesses. Charge-tunneling material is formed adjacent the charge-storage material and extends vertically along the first and second levels. Channel material is formed adjacent the charge-tunneling material and extends vertically along the first and second levels. The additional material of the second levels is removed to leave voids. Conductive material is formed within the voids.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a vertical stack of alternating insulative levels and conductive wordlines; the conductive wordlines having terminal ends and the insulative levels comprising two separate insulative material structures;
   a single layer of charge-blocking material extending along the stack;
   a charge-storage material comprising discrete segments adjacent the terminal ends of the conductive wordlines;
   a charge-tunneling material extending vertically along the stack; and
   a channel material extending vertically along the stack.

2. The integrated assembly of claim 1 wherein the discrete segments of the charge-storage material are vertically spaced from the insulative levels by only the single layer of the charge-blocking material.

3. The integrated assembly of claim 1 wherein a vertical dimension of each discrete segment of the charge-storage material approximates a vertical dimension of each conductive wordline.

4. The integrated assembly of claim 1 further comprising a liner of dielectric-barrier material surrounding each conductive wordline.

5. The integrated assembly of claim 1 wherein the conductive wordlines comprise two separate conductive material structures.

6. The integrated assembly of claim 1 wherein one of the two separate insulative material structures comprises a terminal end of each insulative level.

7. The integrated assembly of claim 1 wherein one of the two separate insulative material structures comprises a lower dielectric constant than the other one of the two separate insulative material structures.

8. The integrated assembly of claim 1 wherein one of the two separate insulative material structures comprises a more porous structure than the other one of the two separate insulative material structures.

9. The integrated assembly of claim 1 wherein the charge-storage material comprises at least one of silicon oxynitride, conductive nanodots and floating gate material.

10. The integrated assembly of claim 1 wherein the charge-storage material comprises polycrystalline silicon.

11. A method of forming an integrated assembly, comprising:
    forming a vertical stack of alternating insulative levels and sacrificial levels, the sacrificial levels comprising terminal ends configured as first recesses;
    forming an insulative material along the vertical stack and filling the first recesses;
    removing the insulative material along the sacrificial levels, the removing forming second recesses at terminal ends of the sacrificial levels; and
    forming charge-storage material within the second recesses leaving discrete segments adjacent the terminal ends of the sacrificial levels.

12. The method of claim 11 further comprising forming a single liner of charge-blocking material between the charge-storage material and the vertical stack.

13. The method of claim 11 further comprising replacing material in the sacrificial levels with conductive material after the filling of the first recesses.

14. The method of claim 11 further comprising replacing material in the sacrificial levels with conductive material after the forming of the second recesses.

15. The method of claim 11 further comprising replacing material in the sacrificial levels with conductive material after the forming of the charge-storage material.

16. The method of claim 11 further comprising replacing material in the sacrificial levels with two separate structures of conductive material.

17. The method of claim 11 further comprising forming charge-tunneling material along the vertical stack.

18. The method of claim 11 further comprising forming channel material along the vertical stack.

* * * * *